United States Patent [19]
Becker

[11] 3,737,791

[45] June 5, 1973

[54] CONTROL DEVICE FOR FILTER CIRCUITS CONNECTED IN PARALLEL WITH EACH OTHER AND TUNED TO DIFFERENT RESONANCE FREQUENCIES

[75] Inventor: Michael Becker, Uttenreuth, Germany

[73] Assignee: Siemens Aktiengesellschaft, Munich, Germany

[22] Filed: May 18, 1972

[21] Appl. No.: 254,405

[30] Foreign Application Priority Data

June 1, 1971 Germany....................P 21 27 108.9

[52] U.S. Cl.................................328/167, 333/70 R

[51] Int. Cl................................................H03h 7/10

[58] Field of Search....................328/167; 333/70 R, 333/70 CR

[56] References Cited

UNITED STATES PATENTS 3,022,471 2/1962 Murk..............................328/167 X 3,585,498 6/1971 Chandos..........................328/167 X 3,668,570 6/1972 Lautier et al.....................328/167 X

*Primary Examiner*—John S. Heyman

*Attorney*—Hugh A. Chapin

[57] ABSTRACT

A control device for filter circuits connected in parallel with each other and tuned to different resonance frequencies is disclosed. To prevent the occurrence of parallel resonances in the filter circuits connected to an electrical system in the event of sudden load changes or faults in the system, the control device switches the reactive member of these filter circuits in steps to retune the same in accordance with changes in the fundamental frequency of the system. The switching takes place upon reaching predetermined values of frequency deviation and frequency rate of change.

5 Claims, 5 Drawing Figures

Patented June 5, 1973

3,737,791

3 Sheets-Sheet 2

CONTROL DEVICE FOR FILTER CIRCUITS CONNECTED IN PARALLEL WITH EACH OTHER AND TUNED TO DIFFERENT RESONANCE FREQUENCIES

BACKGROUND OF THE INVENTION

The invention relates to a control device for preventing the occurrence of parallel resonance in filter circuits connected in parallel with each other in an electrical system. More particularly, the invention relates to such a control device which switches step-portions of the reactance component of the individual filter circuits to retune these circuits in accordance with changes in the fundamental frequency of the system caused, for example, by faults or load changes in the system.

Particularly in three-phase systems with connected converter circuits, harmonics of various frequencies occur which are filtered out by means of filter circuits, for example, in the form of series resonant circuits connected in parallel to each other, each circuit consisting of a series connection of a capacitor and a choke.

In such filter circuits, the resonance frequency can be adjusted to compensate for the capacitance and inductance variations at different temperatures by measuring the current and the voltage in the resonant circuit in question and adjusting the phase angle to the value zero. Such regulating and control devices are built for compensating the stationary changes of the components and are poorly suited to compensate tuning errors which are caused by sudden changes of the fundamental frequency. Especially if several resonant circuits tuned to different frequencies are provided, there is the danger that in the event of short-term fluctuations of the frequency, for example, as in the case of a sudden opening of the line, or in carrying out a short interruption procedure with several successive disconnect operations, the control deviations that occur if the individual resonance frequencies are rapidly readjusted, can add up in such a manner that a parallel resonance can temporarily occur. Such parallel resonances occur between the respective frequencies for which the resonance circuits are provided.

A circuit with resonant circuits connected parallel to each other is shown in FIG. 1. The corresponding impedance curve of this parallel circuit is shown in FIG. 2. In FIG. 1 are shown series resonant circuits R5, R7, R11, R13 and RH, which, corresponding to the reference number used, are to be tuned respectively to the 5th, 7th, 11th and 13th harmonic of the system. The series-resonant circuit RH acts approximately as a highpass filter, for which purpose the inductance of the resonant circuit is shunted by a resistor. The magnitude of the complex impedance Z of this configuration is shown in FIG. 2 as a function of the frequency $f$. The currents of the individual harmonics are entered as black bars S at the respective frequencies. From FIG. 2, it can be seen that, for example, between the 11th and 13th harmonics, a parallel resonance for the current of the 11th and 13th harmonics becomes effective if the 50-Hz fundamental frequency is shifted by only 10 percent, this corresponding to a horizontal shift of the curves in FIG. 2; this shift causes the resonant circuits to no longer fulfill their purpose of filtering out harmonics. Rather, it is necessary to switch these circuits off in a mode of operation that avoids overloads. Short-term frequency variations of this order of magnitude are unavoidable in a system for very high voltages, particularly where power generating plants feed into directcurrent systems because load surges, such as caused by faults in the line, must always be expected.

SUMMARY OF THE INVENTION

It is an object of the invention to prevent frequency changes introduced into an electrical system equipped with parallel-connected resonant filter circuits tuned to different frequencies from impairing the operation of these filter circuits. Such frequency changes are caused, for example, by sudden load surges.

Subsidiary to this object, it is an object of the invention to provide a control device for returning the filter circuits to resonance in accordance with shifts in the fundamental frequency of the system.

It is another more specific object of the invention to provide such a control device which responds to the frequency deviations and/or frequency rate changes accompanying such shifts in fundamental frequency to retune the parallel connected filter circuits.

The control device of the invention functions with filter circuits connected parallel with each other and tuned to different resonance frequencies. Each of the circuits has a reactance, consisting of reactance step-portions switchable stepwise for retuning the circuit in accordance with changes in the fundamental frequency $f_o$ of the system.

According to a feature of the invention, the control device includes deviation measuring means for measuring deviations $\Delta f_o$ in frequency $f_o$ and derivative measuring means for measuring the rate of change $df_o/dt$ of frequency $f_o$. Deviation comparator means is connected to the deviation measuring means and is changeable from a quiescent to an active state in response to signals therefrom indicative of predetermined frequency deviations. Derivative comparator means is connected to the output of the derivative measuring means and is responsive to signals therefrom indicative of predetermined frequency rate changes. A plurality of linking circuits are connected to the respective outputs of the deviation and derivative comparator means; these linking circuits are operatively connected to the reactance step-portions respectively for switching in a selected number of the step-portions when the deviation comparator means and the derivative comparator means have responded respectively to a frequency deviation and a frequency rate change in the direction of increasing the deviation, and for then, after a time delay, switching out the selected number of step-portions when the deviation comparator means returns to the quiescent state.

According to another feature of the invention, each of the linking circuits includes a switching means for immediately switching out the reactance step-position operatively connected thereto when the deviation comparator means has returned to the quiescent state after having responded to a signal from the deviation measuring means indicative of a predetermined frequency deviation and when, at the same time, the derivative comparator means has responded to a frequency rate change in a direction of decreasing the last-mentioned frequency deviation.

According to a further feature of the invention, the time delay switching means includes ancillary switching means for immediately switching out the reactance step-position operatively connected to the one linking circuit when the deviation comparator connected to this linking circuit has returned to the quiescent state and when at the same time, the frequency derivative comparator responsive to a frequency rate change decreasing the deviation has responded.

The deviation comparator means can include a plurality of deviation comparators connected to respective ones of the linking circuits. These comparators are changeable from a quiescent to an active state in response to respective predetermined frequency deviations. The derivative comparator means includes at least two derivative comparators responsive to predetermined frequency rate changes. One of the derivative comparators is responsive to a frequency rate change increasing a frequency deviation, and the other derivative comparator is responsive to a frequency rate change decreasing the frequency deviation, each derivative comparator being connected individually to each of the linking circuits. Each one of the linking circuits has switching means for switching in the reactance step-portion operatively connected thereto when the deviation comparator connected to the one linking circuit and the derivative comparator responsive to a frequency rate change increasing a frequency deviation have responded to signals from the deviation measuring means and the derivative measuring means, respectively. Also included are time delay switching means for switching out, after a time delay, the reactance step-portion switched in by the first-mentioned switching means when the comparator connected to the linking circuit has returned to the quiescent state.

For the control device, a portion of the predetermined frequency deviations is positive with respect to the fundamental frequency and the remainder thereof is negative with respect thereto. One of the deviation comparators is responsive to a value of frequency deviation of the portion which is less in magnitude than the remaining frequency deviations of the portion.

According to another feature of the invention, the derivative comparator means includes at least one additional derivative comparator connected to the derivative measuring means and is responsive to a frequency rate change having a magnitude greater than the magnitudes of the first-mentioned predetermined frequency rate changes. The linking circuit connected to the one deviation comparator includes, according to still another feature, an OR-gate having an output operatively connected to the reactance step-position corresponding to the last-mentioned linking circuit. The additional derivative comparator has an output connected to an input of the OR-gate, whereby the last-mentioned reactance step-position is switched in when the additional derivative comparator responds to the frequency rate change of greater magnitude irrespective of whether the predetermined frequency deviation corresponding to the one deviation comparator has been reached.

Although the invention is illustrated and described herein as a control device for filter circuits connected in parallel with each other and tuned to different resonance frequencies, it is nevertheless not intended to be limited to the details shown, since various modifications may be made therein within the scope and the range of the claims. The invention, however, together with additional objects and advantages will be best understood from the following description and in connection with the accompanying drawings.

BRIEF DESCRIPTION OF THE DRAWINGS

FIG. 1 is a schematic diagram of a circuit with resonant circuits connected in parallel to each other, these circuits being tuned to several harmonics of the system respectively.

FIG. 2 is a diagram showing the magnitude of impedance for the circuits of FIG. 1 as a function of the frequency of the system to which the circuits are connected.

Embodiments of the control device of the invention are illustrated and augmented in the other FIGS. described below.

Figure 1:
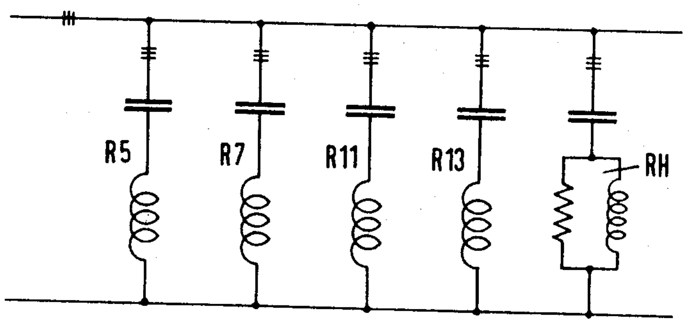
FIGS. 1 and 2 of the drawings were referred to above and show the impedance situation in an electrical system subjected to shifts in the fundamental frequency and not equipped with a control device according to the invention.
Figure 2:
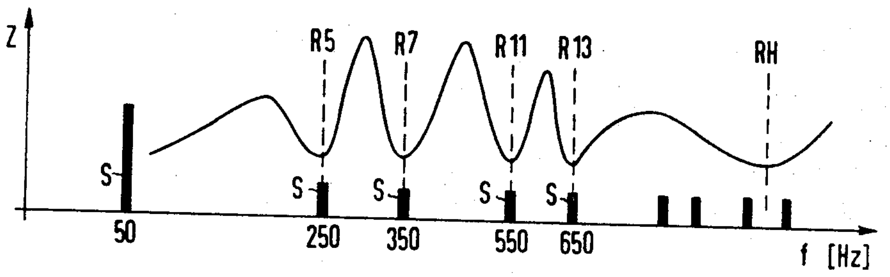
Figure 3:
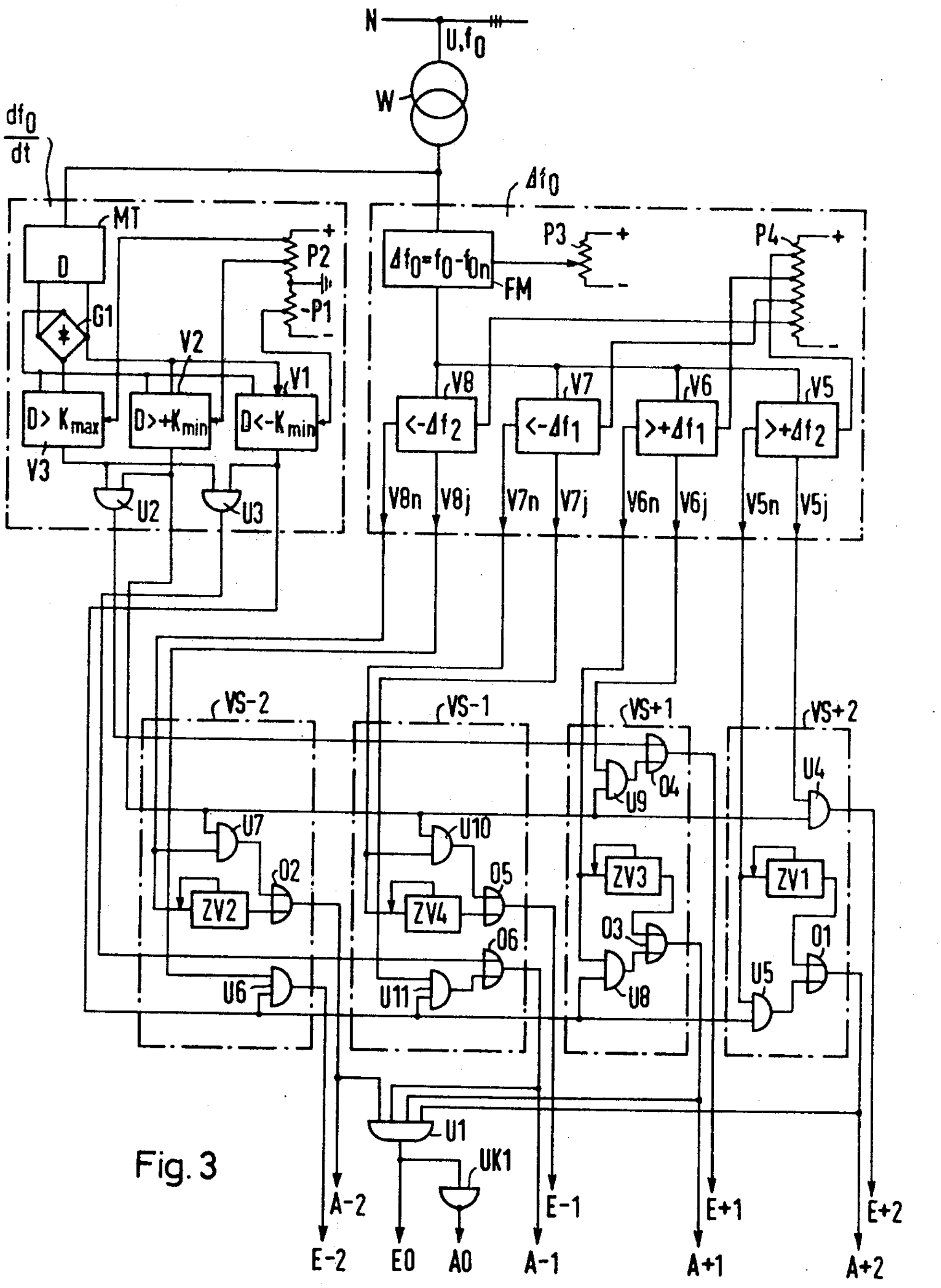

FIG. 3 is a schematic diagram of a control device according to the invention. The control device is shown coupled through a transformer to a system having a fundamental frequency $f_o$.

Figure 4:
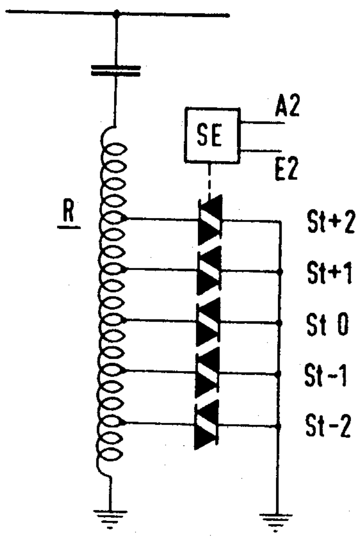

FIG. 4 illustrates a reactance of a filter circuit. The reactance has step-portions which are switchable by the control device in accordance with shifts in the fundamental frequency of the system.

Figure 5:
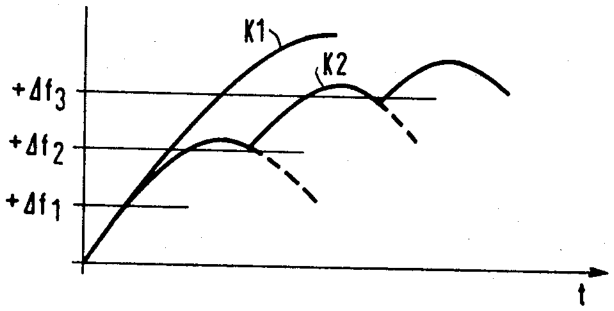

FIG. 5 illustrates the frequency behavior in the event of a sudden removal of load from the line or the removal of a portion of the system, with and without short-term interruption, as a function of time $t$.

DESCRIPTION OF THE PREFERRED EMBODIMENTS

Referring to FIG. 4, a single-phase representation of a series-resonance circuit R is shown which can be switched in steps. The choke of this series-resonance circuit has five taps which are connected to ground, each through an electronic switch. By means of these electronic switches, steps S$t$+2, S$t$+1, S$t$0,S$t$−1 S$t$−2 can be connected or disconnected. For this purpose, a control device SE is provided for the electronic switch of each step of which only the control device for the switch of step S$t$+2 is shown. Into each control device there feeds a line A2 for opening the associated electronic switch, and a line E2 for closing the switch. For compensating temperature variations, a supplemental fine tuning of the resonance frequency can, of course, be provided additionally in each resonant circuit using known techniques, for example, by means of a phase-angle measurement. The resonant circuit R should be tuned to normal frequency without frequency deviation due to load surges if the electronic switch of the step S$t$0 is closed. This operational case always exists if the electronic switches of the steps S$t$+2, S$t$+1 are open and that of the step S$t$0 is closed.

For this reason, as is shown in FIG. 3, the line E0 is connected with the lines for opening the remaining steps via an AND gate U1, while the line A0 is connected to the line E0 via an inverter element UK1. The lines for closing the electronic switches of the other steps are designated with E−2 to E+2, and the lines for opening the electronic switches of the other steps with A−2 to A+2. The voltage U in the system N and the fundamental frequency $f_o$ are transmitted via a transformer W to a measuring device $\Delta f_o$ for determining the frequency deviation and to a measuring device $df_o/dt$ for determining the rate of change of the frequency. In measuring device $df_o/dt$ there is a measuring unit MT, at the output of which appears a direct-current voltage which is proportional to the derivative D of the fundamental frequency with respect to time. To the output of this measuring unit MT is connected a comparator V1 whose second input is connected to a potentiometer P1. This potentiometer is connected between a negative potential and ground, so that the comparator V1 delivers a signal at its output if the derivative D of the fundamental frequency with respect to time falls below a given value $-K_{min}$. To the output of the measuring unit MT is further connected a second comparator V2. The comparator V2 is connected in a similar manner with the tap of a potentiometer P2 which is connected between a positive potential and ground. The comparator V2 therefore delivers a signal if the differential quotient D is larger than a value $+K_{min}$. A third comparator V3 is connected through a rectifier G1 with the output of the measuring unit MT. In this way, only the magnitude of the direct-current voltage appearing at the output of the measuring unit MT becomes effective. The comparison input of the comparator V3 is connected to a second tap of the potentiometer P2, so that at the output of this comparator V3, a signal appears only if the differential quotient D exceeds a larger value, designated $K_{max}$.

The output of comparator V3 is connected to the input of each AND gate U2 and U3. The second input of the AND gate U2 is connected to the output of the comparator V2, so that a signal appears at the output of the AND gate U2 if the magnitude of the differential quotient is so large that it exceeds the value $K_{max}$ and if the frequency change is in the direction of increasing the frequency. The second input of the AND gate U3 is connected with the comparator V1, so that at the output of the AND gate U3 a signal appears if the differential quotient D exceeds the value $K_{max}$ and if the differential quotient is negative, that is, if the frequency changes in the direction of decreasing frequency. In the case that the differential quotient D is smaller than the value $K_{max}$ but larger than the value $K_{min}$, a signal will appear either at the output of the comparator V1 or at the output of the comparator V2 depending upon the sign of the differential quotient D.

The input for the measuring device $\Delta f_o$ for measuring the frequency deviation is connected to a frequency measuring unit FM. The reference value for the frequency is taken here from a potentiometer P3 connected between a positive and a negative potential. Four comparators V5, V6, V7 and V8 are connected to the output of the frequency measuring unit FM. The reference inputs for these comparators are connected to a potentiometer P4 which is also connected between a negative and a positive potential. The comparator V5 responds if the frequency deviation is larger than a value $+\Delta f2$; the comparator V6 responds if the frequency deviation is larger than the value $+\Delta f1$; and the comparators V7 and V8 respond if the frequency deviation is smaller than values $-\Delta f1$ and $-\Delta f2$, respectively. Each of the comparators V5 to V8 has two outputs, of which one always carries a signal. The outputs designated with *j* carry a signal if the comparison condition is fulfilled, whereas, the outputs designated with *n* carry a signal if the corresponding comparison condition is not fulfilled.

In FIG. 5 is shown a curve for a positive frequency deviation, which illustrates how the frequency deviation comes about as a function of time in the event of a line fault. The curve K1 can here be considered as illustrative for a line fault if no short-term interruption procedure is carried out in the particular line of the system. If equipment for temporarily interrupting the line is available, the curve K2 results for example. The steepest rise of the curve K1 and the curve K2 prior to each new closing operation is, for example, somewhat higher than the value $K_{max}$ provided for the comparator V3. In the illustrated embodiment, a comparator for the value $+\Delta f3$ is not shown because providing such a comparator would illustrate nothing new over the comparator V5. The values for the frequencies at which the stepwise switching is to take place are set in dependence upon the corresponding installation site and the frequency changes which are produced there in the event of line faults or other load surges.

As is further shown in FIG. 3, each one of the steps St+2, St+1, St−1 or St−2 is assigned to respective ones of the comparators V5 to V8. Between the outputs of the comparators V5 to V8 and the associated lines A and E for respectively opening and closing the associated electronic switch are arranged respective linking circuits VS−2 to VS+2. The output V5*j* and the output of the comparator V2 are connected to an AND gate U4. The output of AND gate U4 is connected to the line E+2 for switching in the step St+2. This assures that step St+2 is connected if the frequency deviation $+\Delta f2$ is exceeded and if, at the same time, the rate of frequency change exceeds the value $K_{min}$.

In the event that the frequency change is according to curve K2 in FIG. 5, a signal will therefore appear at the line E+2 if, at the second reclosing of the line, the frequency curve starts out with the next rise toward the value $+\Delta f3$; whereas, for the curve K2 indicated by a broken line, when no second short interruption is necessary, this step St+2 is not connected. Unnecessary switching operations can thereby be avoided, which in the event of rapid frequency changes can result in a run-away condition of the control. It is furthermore assured that a step is connected only if it is to be expected on the basis of the rate of the frequency change that the range to the next step of the frequency deviation will still be traversed.

An OR gate o1 is connected to the output V5*n* through a time delay member ZV1. In addition, this output V5*n* is connected to an AND gate U5, whose second input is connected to the output of the comparator V1. The output of AND gate U5 is also connected to an input of the OR gate O1. To the output of the OR gate O1 is wired the line A+2 for disconnecting the step St+2. From this it will be seen that the step St+2 is always disconnected if the frequency deviation falls below $+\Delta f2$ and the time delay of the stage ZV1 has run out. In the case that the frequency decreases rapidly, so that the value $-K_{min}$ for the differential quotient D of the frequency with respect to time is exceeded, a signal will appear also at the output of the comparator V1, and the line A+2 for disconnecting the step St+2 receives a signal for disconnecting this step immediately when the frequency deviation falls below $+\Delta f2$.

In a similar manner, the comparator V8 is linked with the lines E−2 and A−2 for connecting and disconnecting the step St−2. The AND gate U6 corresponds here to the AND gate U4 and is connected to the output V8j of the comparator V8 and to the output of the comparator V1. This step is connected only if a frequency change in the direction to lower frequency is present and, at the same time, the frequency deviation falls below $-\Delta f2$. The time delay stage ZV2 is therefore inserted, similar to the time delay stage ZV1, ahead of an OR gate O2, the latter corresponding to the OR gate O1; whereas, there is inserted ahead of the input of the OR gate O2, an AND gate U7 having one input connected to the output V8*n*, and whose other input is connected to the output of the comparator V2. The outputs of the two AND gates U2 and U3 are introduced only into the linking circuits VS−1 and VS+1. A signal occurs on one of the two outputs only if a very large frequency change rate occurs, the output carrying the signal being determined by the direction of the frequency change. The circuit of the OR gate O3, the time delay device ZV3 and the AND gate U8 correspond to the circuit of the OR gate O1 with the time delay member ZV1 and the AND gate U5. The AND gate U9 following the comparator V6 is connected in the same way as the AND gate U4. In contrast to the AND gate U4, the AND gate U9 is not connected directly to the line for connecting the corresponding step S*t*+1, rather, it is connected through an OR gate O4. The second input of the OR gate is connected to the output of the AND gate U2; this permits the step S*t*+1 to be connected by a signal on the line E+1 already when the appertaining frequency deviation $+\Delta f1$ is not yet reached. This circuit is advantageous if, in the event of a line fault, that is, in the case of a large frequency change, it is established with certainty that the value $+\Delta f1$ for the frequency deviation will be substantially exceeded.

In the linking circuit VS−1, preceding the step S*t*−1, the circuit of the OR gate O5, the AND gate U10 and the time delay device ZV4 corresponds respectively to the circuit of the OR gate O2, the AND gate O7 and the time delay device ZV2. The AND gate U11 corresponds on the input side to the AND gate U6 and, like the AND gate U9, is not connected directly on the output side to the line E−1 for connecting the step S*t*−1, but is wired through an OR gate O6. The second input of this OR gate O6 is connected to the AND gate U13, which carries an output signal if the comparator V3 responds, that is, for the maximum rate of frequency change in the direction of decreasing frequency, and causes the immediate connection of the step S*t*−1 through the line E−1.

With the invention as described above, an apparatus is obtained which, although operating stepwise, reacts rapidly to frequency changes and which can reliably prevent the occurrence of parallel resonance if several parallel-connected resonant circuits are present. Even in case of line faults where a short interruption procedure is carried out, it is assured that the step-wise change of the resonance frequency takes place only if also the permissible tolerance range for the increased or decreased resonance frequency is exhausted. Therewith, even with rapid frequency changes, sufficiently long "on" times for the individual steps are obtained, so that the resonant circuits can settle at the new resonance frequency before switch back must occur. Should interference occur at the output for a given configuration of, for example, the measuring unit MT in the frequency-change measuring device, then this interference can be suppressed by additional time delay devices connected following the comparators V1 to V3.

What is claimed is:

1. Control device for filter circuits connected parallel with each other and tuned to different resonance frequencies, each of the circuits having a reactance consisting of reactance step-portions switchable stepwise for retuning the circuit in accordance with changes in the fundamental frequency $f_o$, said device comprising deviation measuring means for measuring deviations $\Delta f_o$ in frequency $f_o$, derivative measuring means for measuring the rate of change $df_o/dt$ of frequency $f_o$, deviation comparator means connected to said deviation measuring means and being changeable from a quiescent to an active state in response to signals therefrom indicative of predetermined frequency deviations, derivative comparator means connected to the output of said derivative measuring means and being responsive to signals therefrom indicative of predetermined frequency rate changes and a plurality of linking circuits connected to the respective outputs of said deviation and derivative comparator means and being operatively connected to the reactance step-portions respectively for switching in a selected number of the step-portions when said deviation comparator means and said derivative comparator means have responded respectively to a frequency deviation and a frequency rate change in the direction of increasing said deviation, and for then, after a time delay, switching out the selected number of step-portions when said deviation comparator means returns to said quiescent state.

2. The control device of claim 1, each of said linking circuits comprising switching means for immediately switching out the reactance step-position operatively connected thereto when said deviation comparator means has returned to said quiescent state after having responded to a signal from said deviation measuring means indicative of a predetermined frequency deviation and when, at the same time, said derivative comparator means has responded to a frequency rate change in a direction of decreasing said last-mentioned frequency deviation.

3. The control device of claim 1, said deviation comparator means comprising a plurality of deviation comparators connected to respective ones of said linking circuits and being changeable from a quiescent to an active state in response to respective predetermined frequency deviations; said derivative comparator means comprising at least two derivative comparators responsive to predetermined frequency rate changes, one of said derivative comparators being responsive to a frequency rate change increasing a frequency deviation, and the other one of said derivative comparators being responsive to a frequency rate change decreasing said frequency deviation, each of said derivative comparators being connected individually to each of said linking circuits; and, each one of said linking circuits comprising switching means for switching in the reactance step-portion operatively connected thereto when the deviation comparator connected to said one linking circuit and said one derivative comparator have responded to signals from said deviation measuring means and said derivative measuring means respectively, and time delay switching means for switching out, after a time delay, the reactance step-portion switched in by said first-mentioned switching means when the comparator connected to said one linking circuit has returned to said quiescent state.

4. The control device of claim 3, said time delay switching means comprising ancillary switching means for immediately switching out the reactance step-position operatively connected to said one linking circuit when the deviation comparator connected to said one linking circuit has returned to said quiescent state and when at the same time, said other one of said derivative comparators has responded.

5. The control device of claim 3 wherein a portion of said predetermined frequency deviations is positive with respect to the fundamental frequency and the remainder thereof is negative with respect thereto, one of said deviation comparators being responsive to a value of frequency deviation of said portion which is less in magnitude than the remaining frequency deviations of said portion, said derivative comparator means comprising at least one additional derivative comparator connected to said derivative measuring means and being responsive to a frequency rate change having a magnitude greater than the magnitudes of said first-mentioned predetermined frequency rate changes, the linking circuit connected to said one deviation comparator comprising an OR-gate having an output operatively connected to the reactance step-position corresponding to said last-mentioned linking circuit, said additional derivative comparator having an output connected to an input of said OR-gate, whereby the last-mentioned reactance step-position is switched in when said additional derivative comparator responds to said frequency rate change of greater magnitude irrespective of whether the predetermined frequency deviation corresponding to said one deviation comparator has been reached.

* * * * *